(12) United States Patent
Blodgett (10) Patent No.: US 7,332,950 B2
(45) Date of Patent: Feb. 19, 2008

(54) DLL MEASURE INITIALIZATION CIRCUIT FOR HIGH FREQUENCY OPERATION

(75) Inventor: Greg A. Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 341 days.

(21) Appl. No.: 11/152,325

(22) Filed: Jun. 14, 2005

(65) Prior Publication Data
US 2006/0279342 A1    Dec. 14, 2006

(51) Int. Cl.
*H03H 11/26* (2006.01)

(52) U.S. Cl. .................. 327/269; 327/273; 327/276; 327/277; 327/284; 327/392; 327/393; 327/395

(58) Field of Classification Search .............. None
See application file for complete search history.

(56) References Cited

U.S. PATENT DOCUMENTS

| | | | | |
|---|---|---|---|---|
| 4,922,141 | A | * | 5/1990 | Lofgren et al. ............ 327/158 |
| 5,337,285 | A | | 8/1994 | Ware et al. ................. 365/227 |
| 5,550,514 | A | * | 8/1996 | Liedberg .................... 331/1 A |
| 5,554,945 | A | | 9/1996 | Lee et al. ................... 327/105 |
| 5,614,855 | A | | 3/1997 | Lee et al. ................... 327/158 |
| 5,621,340 | A | | 4/1997 | Lee et al. .................... 327/65 |
| 5,808,498 | A | | 9/1998 | Donnelly et al. ........... 327/255 |
| 5,930,182 | A | | 7/1999 | Lee ............................ 365/194 |
| 6,047,346 | A | | 4/2000 | Lau et al. ................... 710/126 |
| 6,081,462 | A | | 6/2000 | Lee ............................ 365/194 |
| RE36,781 | E | | 7/2000 | Lee et al. ..................... 327/65 |
| 6,125,157 | A | | 9/2000 | Donnelly et al. ........... 375/371 |
| 6,133,773 | A | | 10/2000 | Werner et al. ............. 327/247 |
| 6,137,325 | A | | 10/2000 | Miller, Jr. .................. 315/224 |
| 6,154,821 | A | | 11/2000 | Barth et al. ................. 711/170 |
| 6,209,071 | B1 | | 3/2001 | Barth et al. ................. 711/167 |
| 6,239,642 | B1 | | 5/2001 | Kim et al. .................. 327/276 |
| 6,263,448 | B1 | | 7/2001 | Tsern et al. ................. 713/501 |
| 6,275,555 | B1 | | 8/2001 | Song .......................... 375/375 |
| 6,281,726 | B1 | | 8/2001 | Miller, Jr. .................. 327/156 |
| RE37,452 | E | | 11/2001 | Donnelly et al. ........... 327/255 |
| 6,369,626 | B1 | | 4/2002 | Donnelly et al. ........... 359/359 |
| 6,369,652 | B1 | | 4/2002 | Nguyen et al. ............... 360/75 |
| 6,373,293 | B1 | | 4/2002 | Best ............................. 327/2 |
| 6,378,018 | B1 | | 4/2002 | Tsern et al. ................. 710/129 |
| 6,385,129 | B1 | | 5/2002 | Silvestri ..................... 365/233 |
| 6,388,480 | B1 | | 5/2002 | Stubbs et al. ............... 327/156 |
| 6,396,329 | B1 | | 5/2002 | Zerbe ......................... 327/336 |
| 6,396,887 | B1 | | 5/2002 | Ware et al. ................. 375/254 |
| 6,405,296 | B1 | | 6/2002 | Barth et al. ................. 711/167 |
| 6,448,756 | B1 | | 9/2002 | Loughmiller ............ 324/76.54 |
| 6,452,431 | B1 | | 9/2002 | Waldrop .................... 327/158 |

(Continued)

OTHER PUBLICATIONS

Micron, "DDR2 offers new features and functionality", *Designline*, 12(2), 3Q03, 16 pgs, 2003.

*Primary Examiner*—Tuan T. Lam
*Assistant Examiner*—Hiep Nguyen
(74) *Attorney, Agent, or Firm*—Schwegman, Lundberg & Woessner, P.A.

(57) ABSTRACT

A memory device, delay lock loop circuit (DLL) and DLL reset circuitry are described. The DLL includes a shift register and a measured delay for pre-loading the shift register. The reset circuitry selectively filters a clock signal propagation through the measured delay during a reset operation.

21 Claims, 8 Drawing Sheets

U.S. PATENT DOCUMENTS

| | | | |
|---|---|---|---|
| 6,473,439 B1 | 10/2002 | Zerbe et al. | 370/503 |
| 6,513,103 B1 | 1/2003 | Garlepp et al. | 711/167 |
| 6,532,522 B1 | 3/2003 | Barth et al. | 711/167 |
| 6,539,072 B1 | 3/2003 | Donnelly et al. | 375/371 |
| 6,542,976 B2 | 4/2003 | Barth et al. | 711/167 |
| 6,553,452 B2 | 4/2003 | Garlepp et al. | 711/105 |
| 6,556,489 B2 | 4/2003 | Gomm et al. | 365/174 |
| 6,570,931 B1 | 5/2003 | Song | 375/235 |
| 6,570,944 B2 | 5/2003 | Best et al. | 375/355 |
| 6,577,554 B2 | 6/2003 | Song et al. | 365/233 |
| 6,603,687 B2 | 8/2003 | Jun et al. | 265/194 |
| 6,621,496 B1 | 9/2003 | Ryan | 345/533 |
| 6,639,956 B1 | 10/2003 | Song | 375/354 |
| 6,642,760 B1 | 11/2003 | Alon et al. | 327/158 |
| 6,643,787 B1 | 11/2003 | Zerbe | 713/400 |
| 6,643,790 B1 | 11/2003 | Yu et al. | 715/500 |
| 6,675,272 B2 | 1/2004 | Ware et al. | 711/167 |
| 6,687,319 B1 | 2/2004 | Perino et al. | 375/367 |
| 6,687,780 B1 | 2/2004 | Garlepp et al. | 710/305 |
| 6,701,446 B2 | 3/2004 | Tsern et al. | 382/168 |
| 6,707,759 B2 | 3/2004 | Song | 365/233 |
| 6,735,709 B1 | 5/2004 | Lee et al. | 257/369 |
| 6,759,881 B2 | 7/2004 | Kizer et al. | 327/174 |
| 6,760,857 B1 | 7/2004 | Lau et al. | 713/500 |
| 6,775,345 B1 | 8/2004 | Song | 375/376 |
| 6,781,416 B1 | 8/2004 | Nguyen et al. | 326/83 |
| 6,781,861 B2 | 8/2004 | Gomm et al. | 365/144 |
| 6,809,974 B2 | 10/2004 | Jones et al. | 365/201 |
| 6,819,603 B2 | 11/2004 | Jones et al. | 365/194 |
| 6,836,503 B2 | 12/2004 | Best et al. | 375/35 |
| 6,836,521 B2 | 12/2004 | Ware et al. | 375/354 |
| 6,838,945 B2 | 1/2005 | Song | 331/112 |
| 6,839,301 B2 | 1/2005 | Lin et al. | 365/233 |
| 6,842,864 B1 | 1/2005 | Barth et al. | 713/401 |
| 6,861,916 B2 | 3/2005 | Dally et al. | 331/172 |
| 6,865,135 B2 | 3/2005 | Choi | 365/233 |
| 6,876,239 B2 | 4/2005 | Bell | 327/158 |
| 6,889,336 B2 | 5/2005 | Schoenfeld et al. | 713/503 |
| 6,897,699 B1 | 5/2005 | Nguyen et al. | 327/295 |
| 6,901,013 B2 | 5/2005 | Jones et al. | 365/194 |
| 6,911,853 B2 | 6/2005 | Kizer et al. | 327/158 |
| 6,917,660 B2 | 7/2005 | Song | 375/373 |
| 6,919,749 B2 | 7/2005 | Alon et al. | 438/758 |
| 6,920,540 B2 | 7/2005 | Hampel et al. | 711/167 |
| 6,922,091 B2 | 7/2005 | Kizer | 327/156 |
| 6,928,128 B1 | 8/2005 | Sidiropoulos | 375/376 |
| 6,937,073 B2 | 8/2005 | Dally et al. | 327/116 |
| 6,937,530 B2 | 8/2005 | Bell | 365/194 |
| 6,944,091 B2 | 9/2005 | Lee et al. | 365/233 |
| 6,949,958 B2 | 9/2005 | Zerbe et al. | 327/3 |
| 6,950,956 B2 | 9/2005 | Zerbe et al. | 713/400 |
| 6,952,123 B2 | 10/2005 | Kizer et al. | 327/147 |
| 6,952,431 B1 | 10/2005 | Dally et al. | 370/516 |
| 6,960,948 B2 | 11/2005 | Kizer et al. | 327/147 |
| 6,960,952 B2 | 11/2005 | Nguyen et al. | 327/175 |
| 6,963,232 B2 | 11/2005 | Frans et al. | 327/158 |
| 6,965,262 B2 | 11/2005 | Zerbe et al. | 327/336 |
| 6,968,024 B1 | 11/2005 | Perino | 375/354 |
| 6,975,149 B2 | 12/2005 | Mikhalev et al. | 327/158 |
| 6,977,655 B2 | 12/2005 | Ryan | 345/533 |
| 6,987,823 B1 | 1/2006 | Stark et al. | 375/354 |
| 6,998,889 B2 | 2/2006 | Best | 327/157 |
| 7,015,721 B2 | 3/2006 | Nguyen et al. | 326/83 |
| 7,030,657 B2 | 4/2006 | Stojanovic et al. | 326/87 |
| 2006/0261869 A1* | 11/2006 | Gomm et al. | 327/158 |
| 2006/0279342 A1* | 12/2006 | Blodgett | 327/158 |

* cited by examiner

DLL MEASURE INITIALIZATION CIRCUIT FOR HIGH FREQUENCY OPERATION

FIELD OF THE INVENTION

The present invention relates to clock synchronization circuitry and, more particularly, to delay lock loop circuits.

BACKGROUND

Delay locked loops (DLLs) are often used in integrated circuits (ICs) to generate an internal clock signal. In a typical DLL, the internal clock signal is generated by applying an amount of delay to a system clock or an external clock signal. The DLL tracks the external and internal clock signals with a detect operation and adjusts the amount of delay with a shifting operation to keep the internal and external clock signals synchronized.

In some integrated circuit devices, such as dynamic random access memory (DRAM) devices, the internal clock signal generated by the DLL is normally used as a timing signal for certain operations of the memory device. For example, in some memory devices, the internal clock signal can be used as a clock signal to provide timing for data transfer to and from the memory device.

Initialization of DLL circuits is typically performed to pre-load shifting circuitry and establish an initial delay amount of the DLL. The initialization circuitry can be complex and provide operational difficulties as system clock frequencies increase.

For reasons stated below which will become apparent to those skilled in the art upon reading and understanding the present specification, there is a need for methods and devices to synchronize signals in an integrated circuit device such as a memory device.

SUMMARY

Embodiments of the invention provide reset circuits for a delay lock circuit having a measured delay. Propagation control circuit is coupled between delay elements of a buffer region and remaining delay elements of the measured delay. The propagation control circuit selectively filters signal state transitions from propagating into the remaining delay elements of the measured delay in response to a reset signal.

Further embodiments provide methods of loading a shift register coupled to a plurality of series coupled delay elements. The methods generate an internal clock signal as a delayed version of an input clock signal which is coupled to an input of the plurality of series coupled delay elements. The internal clock signal is selectively filtered from propagating past a predetermined location of the plurality of series coupled delay elements, and then a content of the a plurality of series coupled delay elements is copied into the shift register.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

Embodiments of the present description may be implemented not only within a physical circuit but also within machine-readable media. For example, the circuits and designs discussed herein may be stored upon and/or embedded within machine-readable media associated with a design tool used for designing semiconductor devices. Examples include netlist files or other machine-readable media for semiconductor design which may be used in a simulation environment to perform the methods of the teachings described herein. The following detailed description is, therefore, not to be taken in a limiting sense, and the scope of the present invention is defined only by the appended claims, along with the full scope of equivalents to which such claims are entitled.

Embodiments of the present invention can include a semiconductor memory device having an array of memory cells. The memory cells can be volatile or non-volatile. For example, a DRAM typically implements charge storage cells, such as trench or container capacitors. Non-volatile memory cells can be charge trapping cells such as floating gate transistors or NROM cells, phase-change memory cells such as chalcogenide cells, programmable conductor random access memory (PCRAM), latching cells such as SRAM, magnetic random access memories (MRAM's), or one-time programmable cells such as ROM cells. In addition, the memory cells can store one or more data bits per cell.

Figure 1:
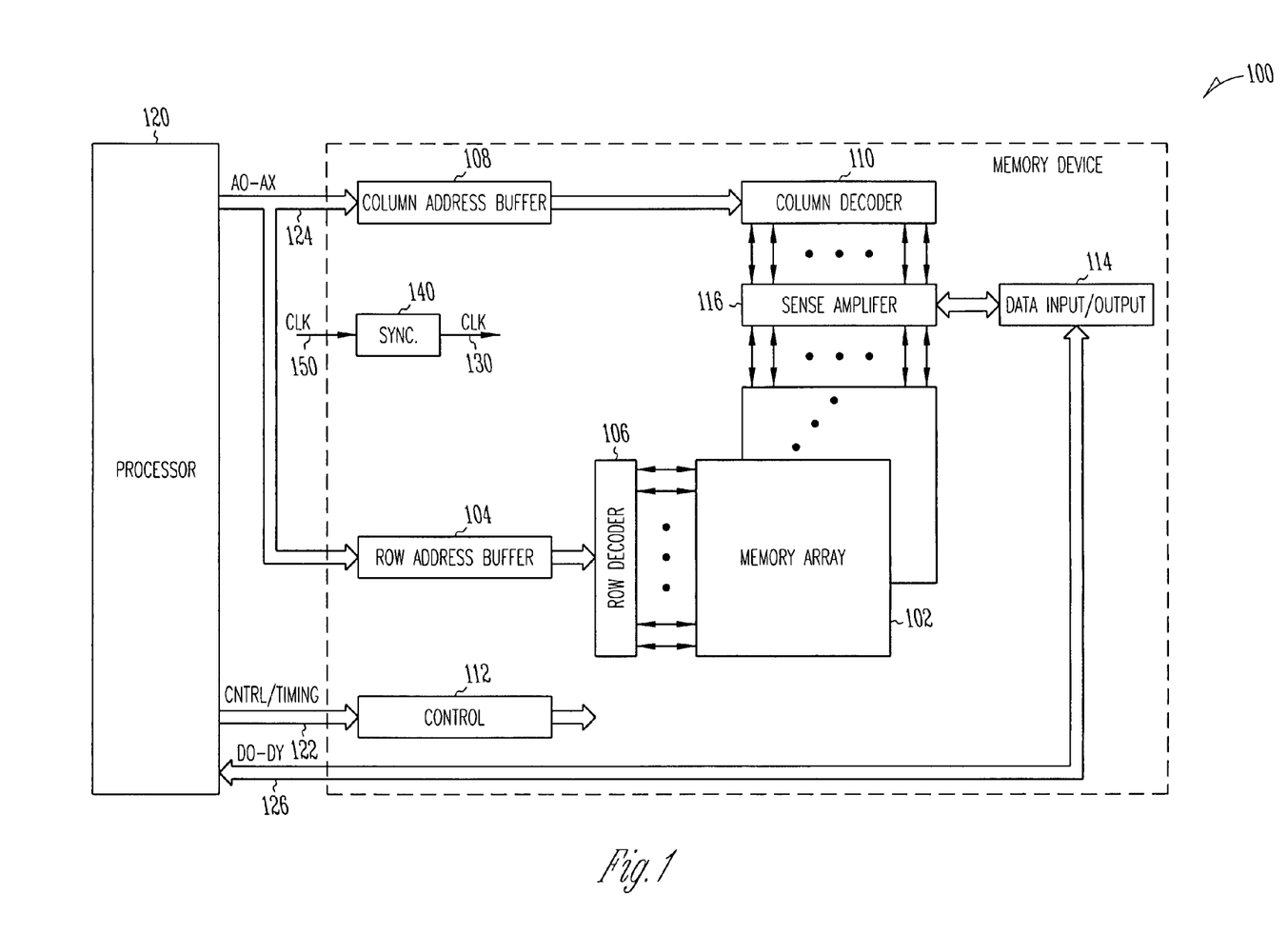
FIG. 1 is a simplified block diagram of an integrated circuit dynamic memory device in accordance with an embodiment of the invention.

FIG. 1 is a simplified block diagram of an integrated circuit dynamic memory device 100 in accordance with an embodiment of the invention. The memory device 100 includes an array of dynamic memory cells 102, a row address buffer 104, row decoder 106, column address buffer 108, column decoder 110, control circuitry 112, and Input/Output (I/O) circuitry 114.

The memory device 100 can be coupled to a processor 120 or other memory controller for accessing the memory array 102. The memory device 100 coupled to a processor 120 forms part of an electronic system. Some examples of electronic systems include personal computers, peripheral devices, wireless devices, digital cameras, personal digital assistants (PDA's) and audio recorders.

The memory device 100 receives control signals across control lines 122 from the processor 120 to control access to the memory array 102 via control circuitry 112. Access to the memory array 102 is directed to one or more target memory cells in response to address signals received across address lines 124. Row address buffer 104 in combination with row decoder 106 access one or more rows of the array. Likewise, column address buffer 108 in combination with column decoder 110 access one or more columns of the array. Once accessed in response to the control signals and the address signals, data is written to or read from the memory cells across data, DQ, lines 126. Data I/O circuitry 114 and sense amplifier circuitry 116 are used to read and write data to the array.

It will be appreciated by those skilled in the art that additional circuitry and control signals can be provided, and that the memory device of FIG. 1 has been simplified to help focus on the invention. It will be understood that the above description of a memory device is intended to provide a general understanding of the memory and is not a complete description of all the elements and features of a typical memory device.

One embodiment of the invention is a synchronous memory device having an internal clock generator. As known to those skilled in the art, synchronizing the internal clock signal 130 to an externally provided clock 150 is performed using a clock synchronization circuit 140. One type of synchronous circuit is a delay lock loop (DLL) circuits that are used to compensate for timing skew between the external clock signal and an internal clock signal.

Figure 2:
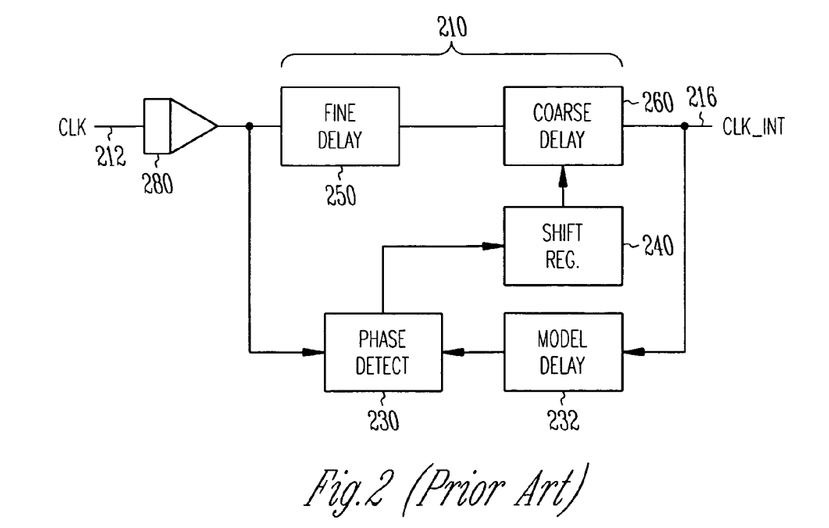
FIG. 2 illustrates a simplified block diagram of a conventional clock synchronization circuit.

Referring to FIG. 2, a simplified block diagram of a conventional clock synchronization circuit includes a variable delay line 210 to delay an external clock signal 212 for a selectable time and to generate an internal clock signal 216, CLK_int, as an output of the variable delay line. A phase detector 230 is provided to compare a phase difference between the external clock signal and the internal clock signal via model delay circuit 232. The phase detector is used to control a shift register 240 which in turn controls the delay line circuitry to establish the selectable time. The variable delay line circuit 210 includes a fine delay line 250 and a course delay line 260 coupled in serial. Each of the fine and course delays has several selectable delay units that determine the overall time delay of the delay line.

Internal clock signal 216 is used to control the timing of output signals from the memory device. Output delay from the clock signal 216 to the output of the memory as well as input delay from the clock input buffer 280 are modeled in model delay circuit 232. Delay from the external clock to an output signal can be represented by the equation:

Internal clock delay=$d1$ (input buffer delay)+delay line delay+$d2$ (output delay).

For the output to be synchronous with the external clock signal 212, the delay line delay should have a delay equal to a multiple of the clock period minus the input delay and minus the output delay, or Delay line delay=$N$*clock period−($d1$+$d2$).

Now, substituting the second equation into the first gives:

Internal clock delay=$d1$+$N$*clock period−$d1$−$d2$+$d2$=$N$*clock period.

Since the internal clock delay is now an integer multiple of the clock period, the output signal will be synchronous with the external clock.

Figure 3:
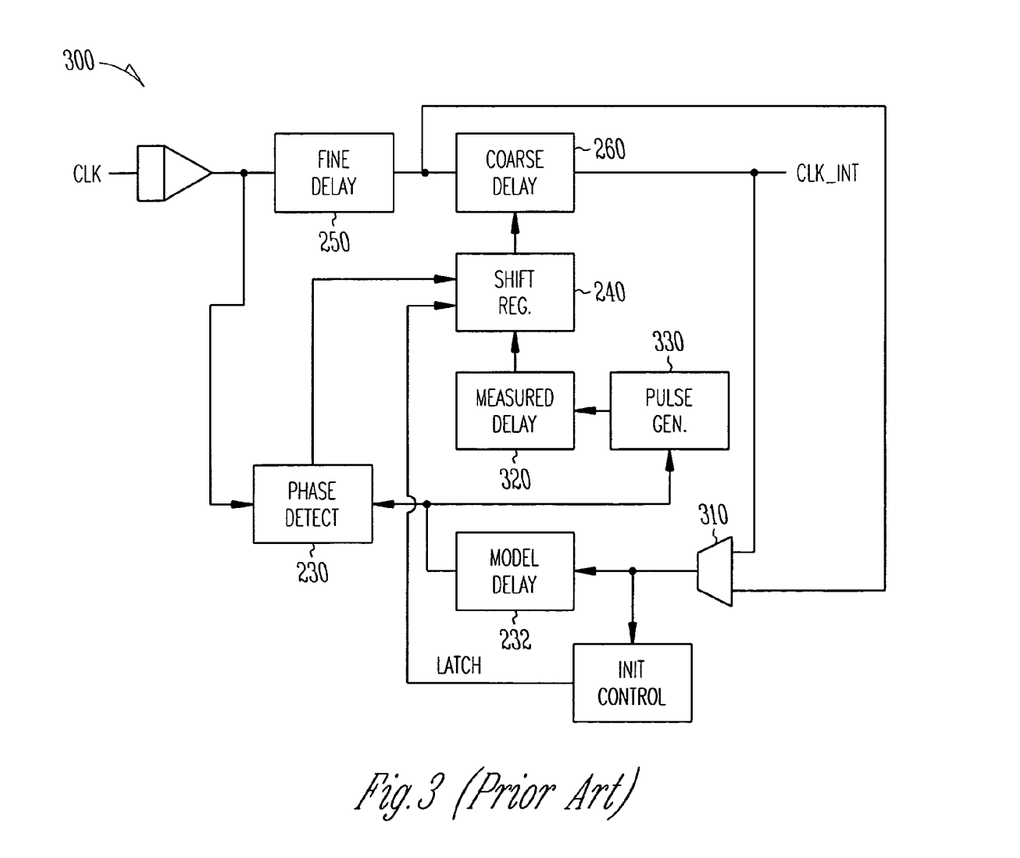
FIG. 3 is a prior art initialization circuit.

To assist in synchronizing the internal and external clock signals, an initialization operation is typically performed to set the course delay circuit. This initialization operation is performed by a feedback circuit that includes a delay model circuit. As illustrated in FIG. 3, a prior art initialization circuit 300 comprises a multiplex circuit 310, model delay circuit 232 and a measure delay array 320. In operation, a series of input clock pulses, CLK, are propagated into the fine and course delay circuits. At the same time, the clock signals are selected by the multiplex circuit 310 and propagate through the model delay circuit 232. The model delay circuit typically models the input clock buffer and output buffer circuit delays (I/O delay) of the DLL circuit.

The initialization operation is designed to measure N*clock period minus $d1$+$d2$ in terms of delay elements so that the delay line can be quickly initialized to the proper delay for output synchronization. The Initialization Control circuit times out a predetermined number of clock cycles N to insure that the measure delay is populated with narrow pulses at the clock frequency. The clock signal used to time the N cycles is delayed through the delay model and converted to narrow pulses at the Pulse generator circuit 330 such that at the end of the N cycle time, the measure delay contains the N pulses offset in time by $d1$+$d2$. The last pulse into the measure delay may be anywhere within the delay including in the buffer region.

As such, by modeling the known buffer delays an initial starting point for the course delay line can by selected to closely approximate synchronization. In some circuit implementations the right-most course delay elements are reserved for a safety zone, or buffer region, in the event that changes in operational conditions require less propagation delay to maintain synchronization.

Figure 4:
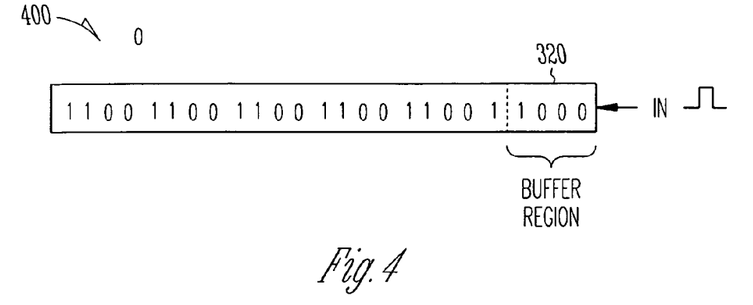
FIG. 4 illustrates data content of measure delay elements of FIG. 3.

The model delayed clock signals then trigger a pulse generator 330 to provide input pulses to the measure delay array 320. The measure delay array comprises serial coupled delay elements that correspond to the course delay units. As illustrated in FIG. 4, four course delay elements of the measured delay circuit are reserved as the buffer region. During initialization, a series of clock pulses propagates through the model delay circuit (right to left) as a series of pulses from the pulse generator. As these pulses propagate asynchronously through the measure delay array 320, the initialization operation triggers the measure delay array to latch the last falling edge of the pulses propagating through the measure delay array. Because it is not desired to latch the falling edge while it is located in the buffer region, the pulse generator provides pulses that are as narrow as is reasonable. That is, a narrow pulse has a lower probability of straddling a boundary of the buffer region. Also, a narrow pulse will have less error between the true falling edge and the edge of the buffer if it is straddling the boundary.

After triggering the latch operation, the location of the last falling edge of the propagating pulses becomes the course delay forward clock input point identified by the shift register 240. As such the measure delay array 320 is used to load the initial shift register data. Before loading the shift register, however, the last pulse transition is propagated to the left such that the elements to the left of the last pulse location are set to a logic one state. The latch operation can be incorporated into the measured delay circuitry and/or the shift register circuitry.

The above described prior art circuit can be dependant upon the pulse width of the output signals from the pulse generator circuit 330. That is, the ability to maintain small pulse width to limit error due to straddling the measured delay buffer region becomes increasingly difficult as clock speeds increase. Embodiments of the present invention, as described below, allow for initialization of the DLL circuit without dependence on the signal pulse width.

Figure 5A:
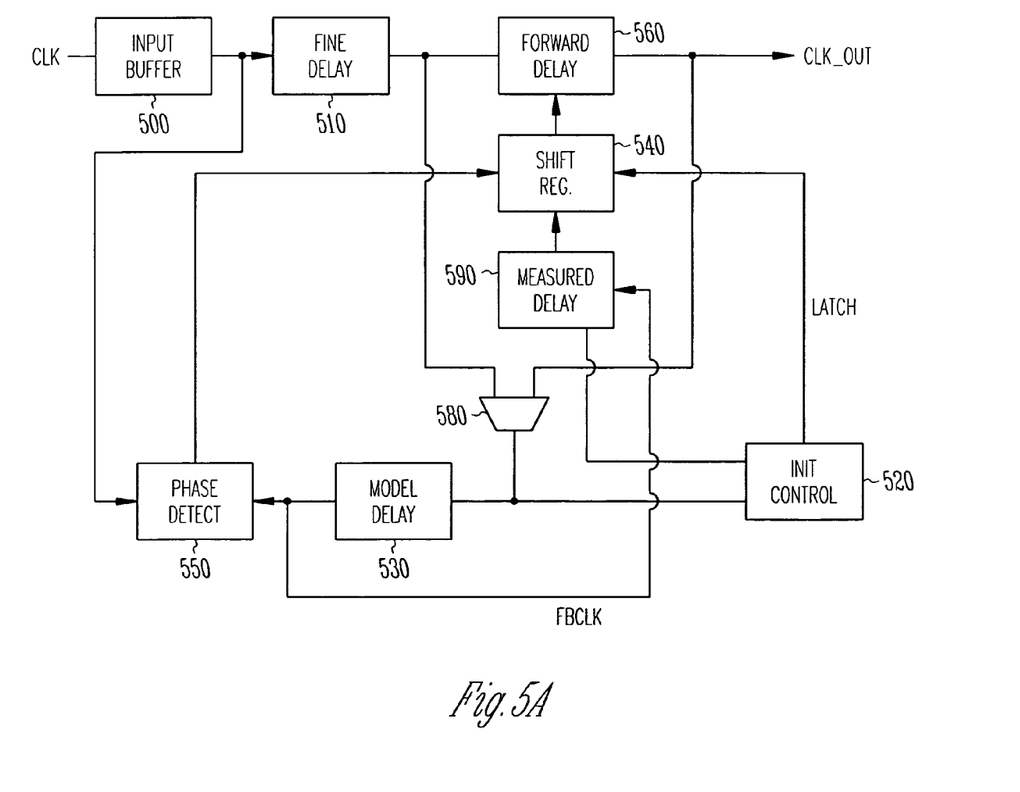
FIG. 5A illustrates a block diagram of an embodiment of the present invention.

FIGS. 5A illustrates a block diagram of an embodiment of the present invention. The external clock signal, CLK, passes through an input buffer 500 and during normal operation the clock signal propagates through a fine delay circuit 510 and the forward delay array 560. A phase detector circuit 550 compares the clock signal with the clock signal output, CLK_OUT from the forward delay array via model delay circuit 530. The model delay circuit 530 is used to compensate for buffer delays in the clock path. The phase detect circuit controls the shift register 540 which in turn controls the forward delay 560.

An initialization procedure can be performed to pre-load the shift register 540 as explained below. Measure delay circuitry 590 processes the clock signal output from the fine delay circuit 510 via multiplex circuit 580 and model delay circuit 530 to determine a start location for the forward delay array 560. Propagation control circuitry is provided, as explained below, to control the clock signal transitions propagating through the measured delay.

Initialization control circuit 520 counts out N cycles of the clock signal from the multiplexer 580. The number of cycles is determined by the maximum total delay possible from the input clock through the input buffer, the fine delay, the multiplexer, the delay model, the buffer region of the delay line and some added margin divided by the minimum cycle time allowed for the clock signal. The result of this calculation is rounded up to a higher integer number to insure that the measure delay path will have a valid signal. FBCLK delayed by the model delay is fed into the measure delay for a minimum of N clock cycles. After the minimum time to insure that the measure delay has valid information, a clock signal from the output of the buffer region of the measure delay is used to trigger the initialization control circuit to register the measurement on the next clock edge. Also, the measure delay circuit prevents further clock signal edges from propagating into the measure delay past the buffer region. This insures that a valid clock edge is the last edge propagating through the measure delay after the trigger signal is detected until the next clock edge when the measurement is latched.

Figure 5B:
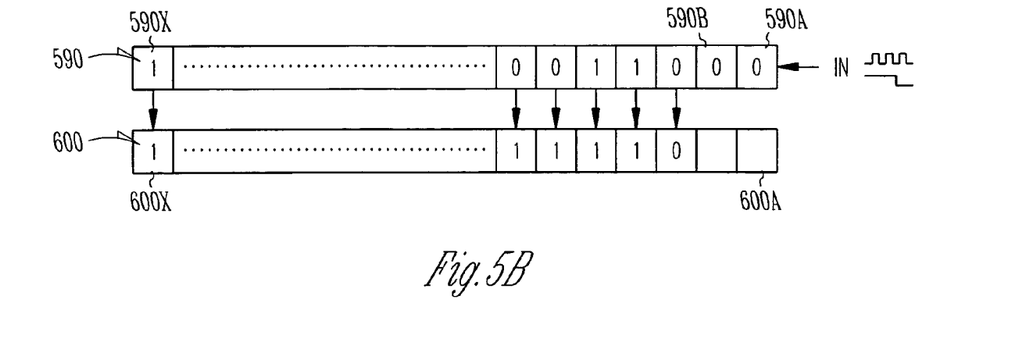
FIG. 5B is a more detailed illustration of components of FIG. 5A.

Referring to FIG. 5B a more detailed illustration of the operation of components of FIG. 5A is provided. The measure delay array 590 comprises delay stages 590*a*-590*x*. The measure delay stages are coupled to a latch circuit 600. The latch circuit can be a separate circuit or incorporated with either the measured delay 590 or the shift register 540. Further, master and slave latches can be used to latch the measured delay data states.

When triggered, the latch circuit latches the data state of its corresponding measure delay stage in latches 600*a*-600*x*. The forward delay array 560 has delay elements corresponding to the measured delay elements and shift register stages. As such, the entry location of the input clock signal CLK of the forward delay is determined by the shift register.

Figure 6:
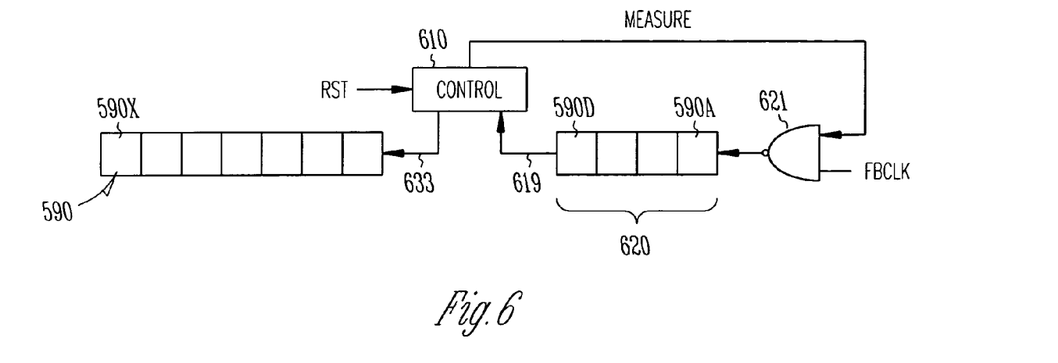
FIG. 6 is an example operation of a measured delay of an embodiment of the invention.

FIG. 6 is a block diagram illustrating a propagation control circuit 610 coupled between delay stages of the measure delay array 590. In one embodiment the buffer region 620 is defined to be a plurality of measure delay stages, such as stages 590*a* to 590*d*. It will be appreciated by those skilled in the art with the benefit of the present description that the number of stages designated as the buffer region can be increased as needed. In response to a reset signal, RST, the propagation control circuit 610 selectively prevents clock signals from propagating out of the buffer region stages into the remaining delay stages of the measure delay array. A gate 621 such as a NAND gate, may be used to prevent additional signal propagation from entering the measured delay. When the initialization information is latched from the measure delay, edges within the buffer region are ignored, so additional clock signal edges could be allowed to enter as long as none can pass beyond the buffer region after a critical time.

Figure 7:
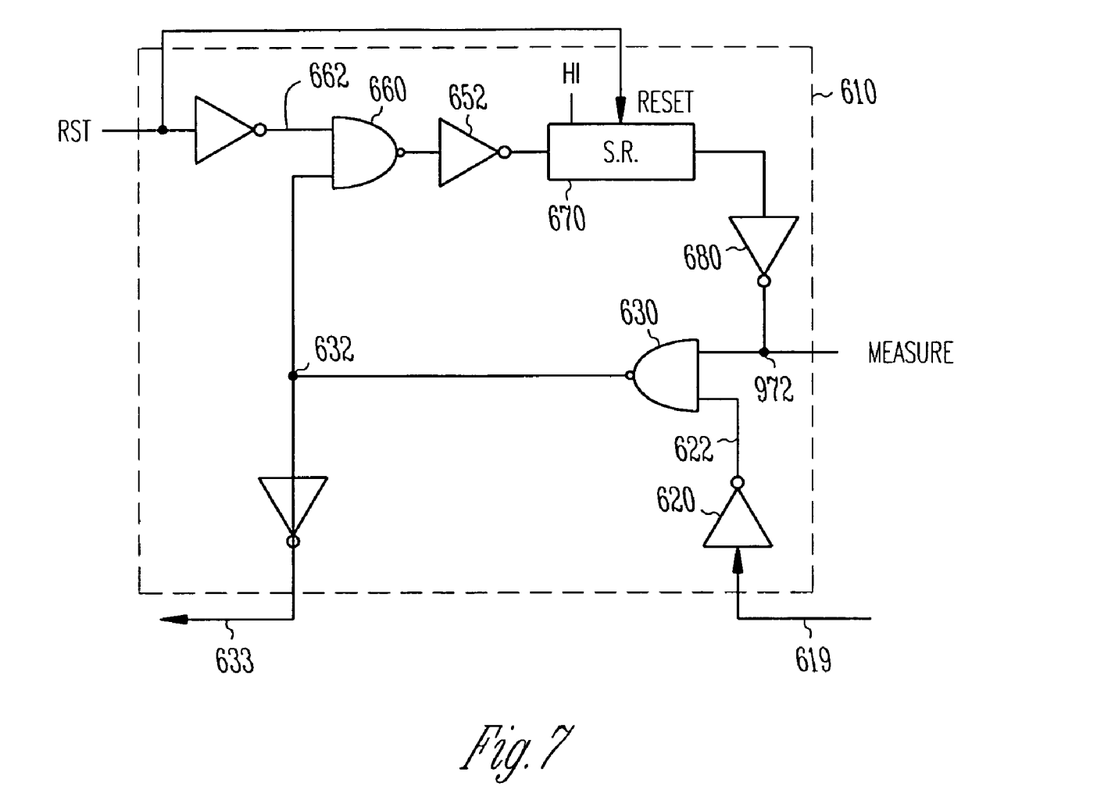
FIG. 7 is another example operation of the measured delay of an embodiment of the invention.

One embodiment of the propagation control circuit 610 is illustrated in FIG. 7. The propagation control circuit is an enabled latch that allows one or more falling edges to propagate through it. Optional shift register 670 can be provided to allow more than one signal edge to propagate during an initialization operation. The shift register includes a number of registers clocked by signal transitions from inverter 652. As such, the number of registers allows a predetermined number of signal state transitions to propagate to node 632.

In this way shift register 670 may be used to count out the minimum N clock cycles instead of a counter within the initialization control circuit. In this embodiment, the minimum number of cycles required to be counted by the shift register 670 will be less since the clock signal has already propagated through the input buffer, the model delay, and the buffer region. In this embodiment, the minimum number of clock cycles N to be counted by the shift register will be determined by other factors such as number of clocks required to insure a stable power supply signal, and noise stability to help guarantee a valid measurement.

NAND gates 630 and 650 are coupled to form a latch circuit. When the latch is enabled by RST node 633 is coupled to node 619 and when the latch is disabled node 633 is latched.

During the initialization operation the RST signal is pulsed high for a predetermined time period which resets the shift register 670. During this time period the output of inverter 660 is low. With node 662 at a low state, NAND gate 650 provides a high level output to inverter 652. A low signal from the reset shift register propagates through inverter 680 to provide a high signal on node 672 to an input of NAND gate 630. Thus, an output of NAND gate 630 (node 632) follows input 622.

When the RST signal changes to a low logic state (node 662 high), NAND gate 650 is 'enabled' such that the output of NAND 630 is inversely coupled to inverter 652. If the input signal on 622 is low, node 632 is also low and node 672 remains high. When node 622 goes high node 632 also goes high. After the shift register propagation time, node 672 will go low and latch node 632 in a high state.

The signal on node 632 is used to clock the shift register 670. The number of stages in shift register 670 determine the number of edge transitions that can propagate out of the buffer 600. In one embodiment the shift register can be eliminated to so that one edge transition is propagated out of the buffer stage following the RST signal. It will be appreciated by those in the art with the benefit of the present description that the terms high and low, rising and falling can be interchanged in embodiments. That is, the signals can be changed by inversion and the present invention is not limited to specific reference directions. The clock signal from the multiplexer is used to latch the state of the measure delay such that the measure delay contains clock signal delay information that approximates an integer number of clock cycles minus the delay model.

Figure 8:
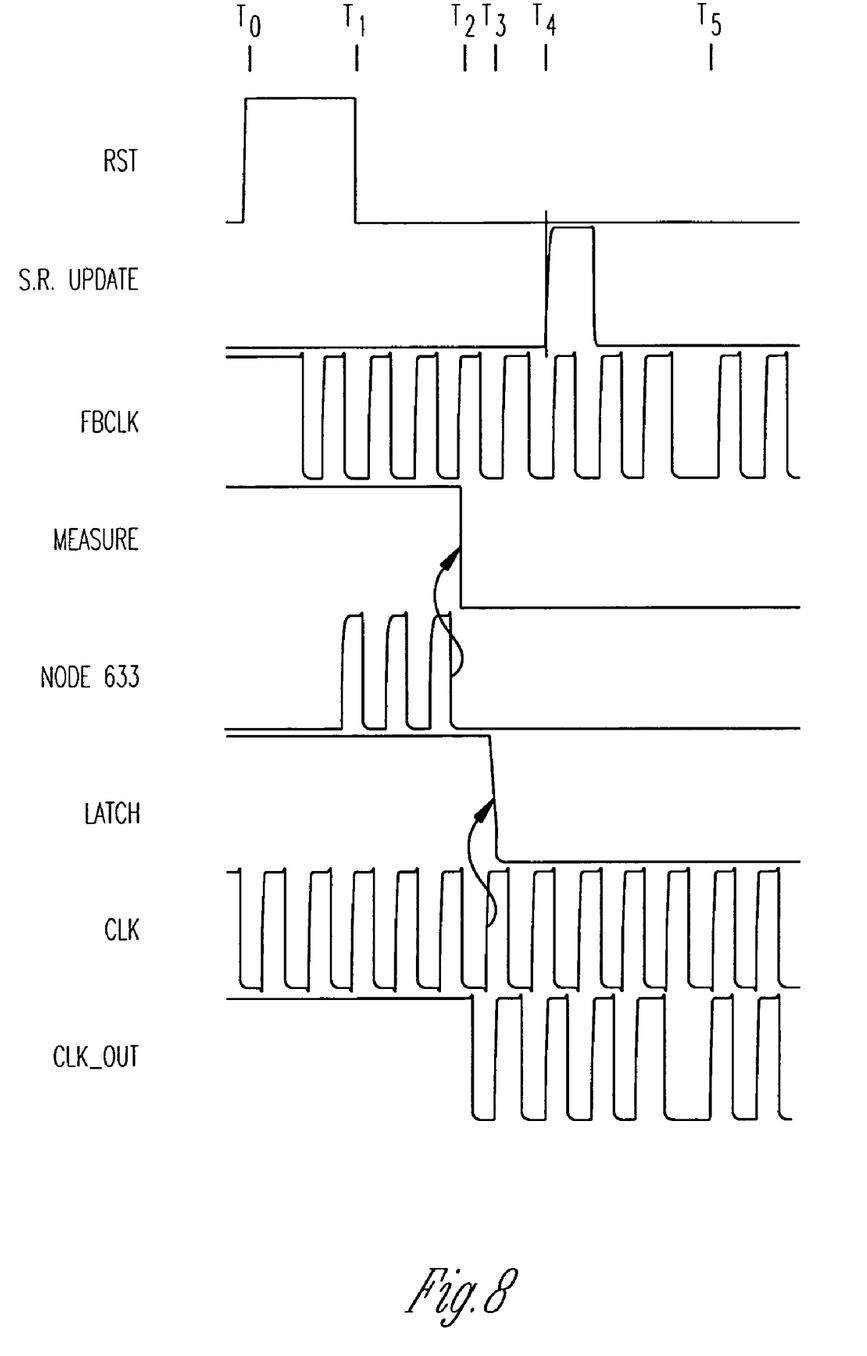
FIG. 8 is a block diagram of a propagation control circuit of an embodiment of the invention.

Referring to FIGS. 5A, 6 and 7 an example operation is illustrated in the timing diagram of FIG. 8. At time T0 the RST clock signal goes to a high state. This resets the propagation control 610 to initialize a reset operation. While the RST signal is high the feedback clock signal, FBCLK, propagates to node 633. At time T1, the RST signal transitions low and the last falling edge of the signal on node 633 is latched as a falling edge of the Measure signal. The Measure signal latches, or filters, additional FBCLK signals from entering the measured delay stages following the buffer region.

At time T3, a latch signal is activated to latch the contents of the measured delay elements in response to a transition of the CLK signal. At time T4 a shift register update signal is pulsed to copy the latched measure delay data to the shift register. At time T5, the CLK signal and CLK_OUT signals are synchronized.

In this embodiment, multiple clock signals propagate out of the buffer region. As such, the latched high signals need to be left shifted asynchronously to fill the latch with data one's to the left of the last transition of node 633.

In the above embodiment, the propagation control circuit selectively filters signal state transitions from propagating out of the buffer delay elements into the remaining delay elements of the measured delay in response to a reset signal. The propagation control circuit includes a latch circuit configured to propagate a predetermined number of signal state transitions and latch an output signal in response to a reset signal.

Figure 9:
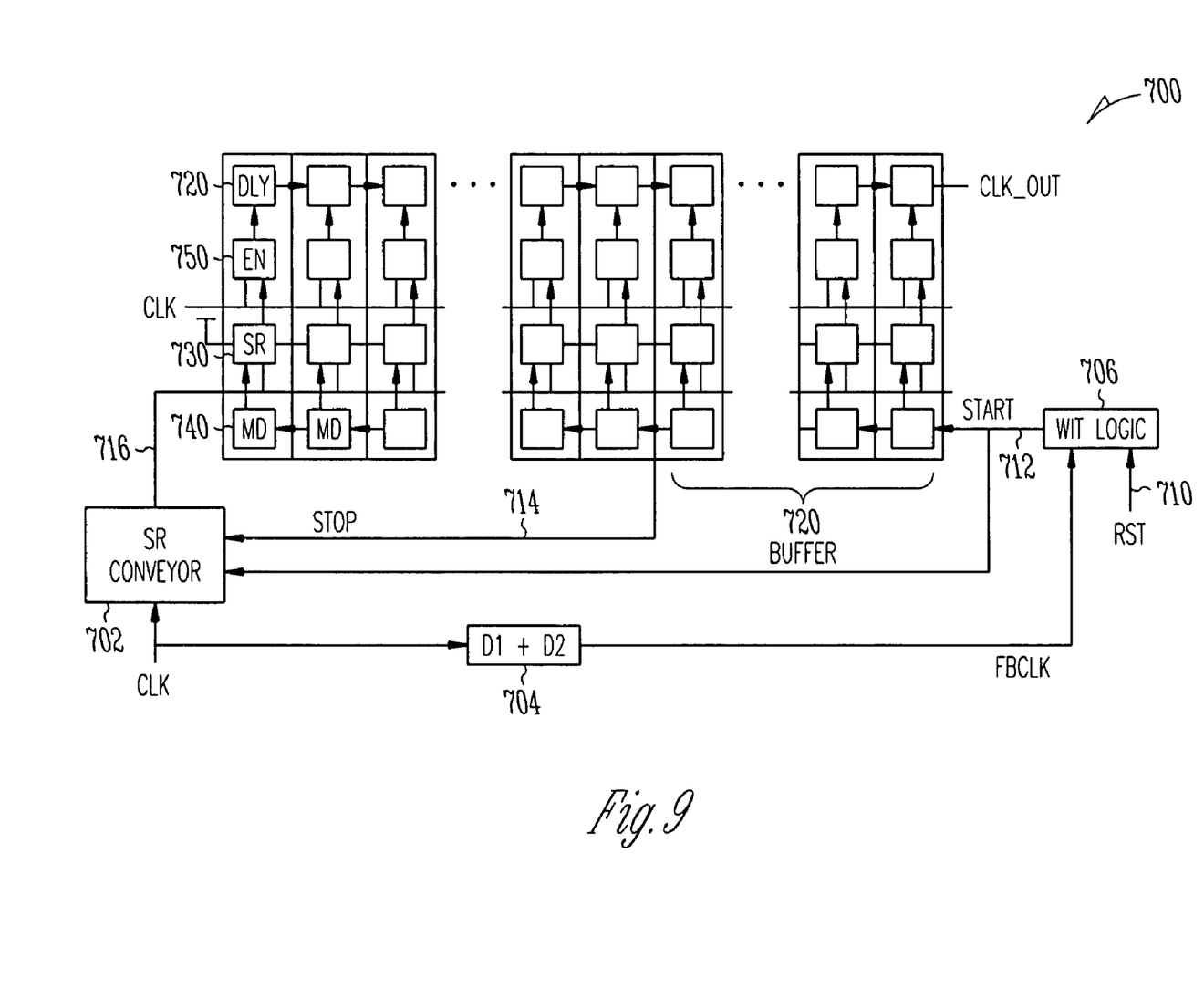
FIG. 9 is a schematic diagram of an embodiment of a propagation control circuit of FIG. 8.
Figure 10:
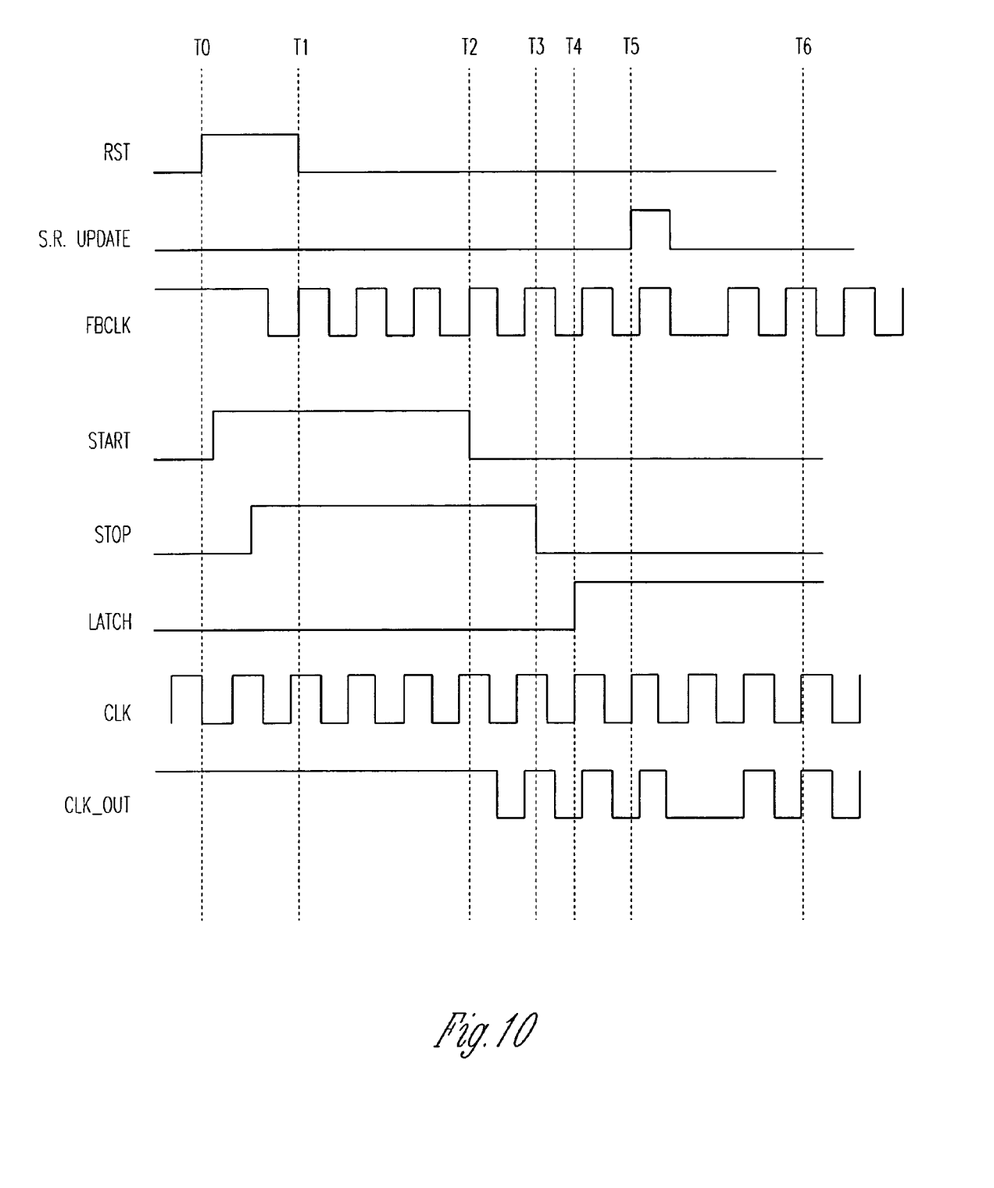
FIG. 10 is an example timing diagram of the operation of the circuit of FIG. 9.

FIGS. 9 and 10 illustrate another embodiment for preloading a control for a DLL. The circuit of FIG. 9 is simplified to show measure delay elements 740, shift register stages 730 and delay line elements 725. Other circuitry, known to those skilled in the art for completing the DLL is not illustrated in this Figure but described above.

The initialization circuitry 700 includes a shift register control 702, a model delay circuit 704 and initialization logic 706. The initialization logic 706 is coupled to an input of a measured delay line elements 740 having a series of measured delay elements 740. A predefined number of the measured delay elements form a buffer region 720.

The shift register control 702 is coupled to shift register 730 having a series of shift register elements 730. The shift register is pre-loaded with contents from the measured delay elements to control enable elements 750. The enable elements determine where the clock signal CLK enters the forward delay elements 725 forming the clock delay of the DLL.

In operation, the clock signal CLK is provided to both the shift register control 702 and the delay circuit 704. The delay circuit has a propagation delay to model a delay in the clock path. As such, a delayed feedback version FBCLK of the CLK signal is provided to initialization circuit 706. A RST signal 710, as shown in FIG. 9, controls the Start signal 712. The RST signal instructs the initialization logic to keep the Start signal high to load the measured delay elements to a high state. The RST signal then instructs the initialization logic to transition the Start signal low in synchronization with FBCLK. The initialization logic then keeps the Start signal low.

The output of the measured delay elements 740 defining the buffer region 720 is provided to the shift register control 702 as a Stop signal. When the Start signal transition (high to low) propagates through the buffer region 720 of the measured delay elements 740 the Stop signal transitions. In response, the shift register control 702 instructs (via Latch signal node 716) the shift registers elements 730 to load the contents of the measured delay in synchronization with the CLK signal. The enable elements 750 control the entry location of the CLK signal into forward delay elements 725.

FIG. 10 is a timing diagram of the operation of FIG. 9. At time T0 the RST signal is high to preload the measured delay with high data states. At time T1 the RST signal goes low to enable the input logic 706 to transition the Start signal low synchronous with a high transition of FBCLK. At time T3 the Start signal has propagated through the buffer region and is used as the Stop signal. At time T4 the shift register control 702 instructs the shift register 730 latches the measure delay data. At time T5 the shift register update is performed so that at Time T6 the CLK and CLK_OUT signals are synchronized.

In an alternate embodiment, the start signal enters the measure delay as shown, but also enters a buffer delay model. The output of the buffer delay model is the stop signal. The buffer delay model is a delay that is designed to approximate the desired buffer region delay. The advantage of this embodiment is that it does not require the stop signal to be routed out of the actual delay line. The disadvantage of this implementation is additional circuitry to form the model, and potential differences between the model and the actual delay line buffer region which may cause the effective buffer region to be different from the desired number of delay stages.

The above embodiment allows a method of loading a shift register coupled to a plurality of series coupled delay elements. The method comprises receiving an input clock signal, generating an internal clock signal as a delayed version of the input clock signal, and providing a start signal having a step from a first state to a second state. The step corresponds to a signal transition of the internal clock signal. The start signal is coupled to an input of the plurality of series coupled delay elements, wherein the start signal propagates through the plurality of series coupled delay elements. A content of the a plurality of series coupled delay elements is copied into the shift register after the step of the start signal reaches a predetermined propagation location in the plurality of series coupled delay elements.

The invention claimed is:

1. A reset circuit for a delay lock circuit comprising a series of forward delay elements, the reset circuit comprising:
   a measured delay comprising a series of delay elements, wherein a plurality of the delay elements are defined as a buffer region; and
   a propagation control circuit coupled between the delay elements of the buffer region and the remaining delay elements of the measured delay, wherein the propagation control circuit selectively filters signal state transitions from propagating into the remaining delay elements of the measured delay in response to a reset signal.

2. The reset circuit of claim 1 wherein the propagation control circuit comprises a latch circuit configured to propagate a predetermined number of signal state transitions and latch an output signal in response to a reset signal.

3. The reset circuit of claim 2 wherein the latch circuit comprises a shift register circuit having X registers, wherein the predetermined number of signal state transitions are X unidirectional signal state transitions.

4. The reset circuit of claim 3 wherein the X unidirectional signal state transitions are low to high signal transitions.

5. The reset circuit of claim 1 wherein the propagation control circuit comprises:
   logic circuitry coupled to receive a clock signal input and provide an output signal to the measured delay, wherein the output signal has a single transition from a first state to a second state in synchronization with one edge transition of the clock signal in response to the reset signal; and a control circuitry coupled to an output of the buffer region, wherein the control circuitry enables a shift register to latch data contained in the delay elements of the measured delay after the one single transition from a first state to a second state of the output signal propagates out of the buffer region.

6. A delay lock loop circuit comprising:
a forward delay having a plurality of series coupled first delay elements;
a shift register coupled to the forward delay, wherein the shift register controls a start location of a clock signal into the series coupled delay elements;
a measured delay having a plurality of series coupled second delay elements, the measured delay is coupled to the shift register to provide pre-load data to the shift register; and
a propagation control circuit coupled to the measured delay, wherein the propagation control circuit selectively filters signal state transitions from propagating past a predetermined location of the series coupled second delay elements of the measured delay in response to a reset signal.

7. The delay lock loop circuit of claim 6 further comprising:
a model delay circuit coupled to the clock signal and an input of the measured delay to provide a second clock signal; and
wherein the propagation control circuit comprises a latch circuit coupled to the predetermined location.

8. The delay lock loop circuit of claim 6 wherein the propagation control circuit comprises:
logic circuitry coupled to receive a delayed version of the clock signal and provide an output signal to the measured delay, wherein the output signal has a single transition from a first state to a second state in synchronization with one edge transition of the delayed clock signal; and
a control circuitry coupled to the measured delay and the shift register, wherein the control circuitry enables the shift register to latch data contained in the second delay elements of the measured delay after the one single transition propagates past the predetermined location of the series coupled second delay elements.

9. The delay lock loop circuit of claim 8 wherein the shift register latches the data from the second delay elements in synchronization with the clock signal.

10. A measured delay circuit comprising:
a first series of delay elements having an first input and a first output, wherein a signal on the first input propagates through the first series of delay to the first output;
a second series of delay elements having a second input and a second output, wherein a signal on the second input propagates through the second series of delay to the second output, wherein the first output is coupled to the second input; and
a control circuit coupled to the first and second series of delay elements, wherein the control circuit selectively filters signal state transitions from propagating into the second input from the first output in response to a reset signal.

11. The measured delay of claim 10 wherein the control circuit comprises a latch circuit coupled between the first output and the second input, the latch circuit is configured to propagate a predetermined number of signal state transitions from the first output to the second input, and configured to latch the second input in response to a reset signal.

12. A method of loading a shift register coupled to a plurality of series coupled delay elements, the method comprising:
receiving an input clock signal;
generating an internal clock signal as a delayed version of the input clock signal;
coupling the internal clock signal to an input of the plurality of series coupled delay elements;
selectively filtering the internal clock signal from propagating past a predetermined location of the plurality of series coupled delay elements; and
copying a content of the a plurality of series coupled delay elements into the shift register.

13. The method of claim 12 wherein selectively filtering comprises:
receiving a reset control signal;
enabling a latch circuit with the reset control signal; and
latching a propagation signal at the predetermined location following a signal transition.

14. The method of claim 13 wherein the content of the plurality of series coupled delay elements is copied into the shift register after latching a propagation signal.

15. A method of loading a shift register coupled to a plurality of series coupled delay elements, the method comprising:
receiving an input clock signal;
generating an internal clock signal as a delayed version of the input clock signal;
providing a start signal having a step from a first state to a second state, wherein the step corresponds to a signal transition of the internal clock signal;
coupling the start signal to an input of the plurality of series coupled delay elements, wherein the start signal propagates through the plurality of series coupled delay elements; and
copying a content of the a plurality of series coupled delay elements into the shift register after the step of the start signal reaches a predetermined propagation location in the plurality of series coupled delay elements.

16. A memory device comprising:
an array of memory cells for storing data;
an output circuit to output data from the array in synchronization with an external clock signal; and
a synchronizing circuit to generate an internal clock signal from the external clock signal, wherein the synchronizing circuit comprises:
a forward delay having a plurality of series coupled first delay elements;
a shift register coupled to the forward delay, wherein the shift register controls a start location of external clock signal into the series coupled delay elements;
a measured delay having a plurality of series coupled second delay elements, the measured delay is coupled to the shift register to provide pre-load data to the shift register; and
a propagation control circuit coupled to the measured delay, wherein the propagation control circuit selectively filters signal state transitions from propagating past a predetermined location of the series coupled second delay elements of the measured delay in response to a reset signal.

17. The memory device of claim 16 wherein the propagation control circuit comprises:
logic circuitry coupled to receive a delayed version of the external clock signal and provide an output signal to the measured delay, wherein the output signal has a single transition from a first state to a second state in synchronization with one edge transition of the delayed clock signal; and a control circuitry coupled to the measured delay and the shift register, wherein the control circuitry enables the shift register to latch data contained in the second delay elements of the measured delay after the one single transition propagates past the predetermined location of the series coupled second delay elements.

18. A memory device comprising:

an array of memory cells for storing data;

an output circuit to output data from the array in synchronization with an external clock signal; and a synchronizing circuit to generate an internal clock signal from the external clock signal, wherein the synchronizing circuit comprises:

a first series of delay elements having an first input and a first output, wherein a signal on the first input propagates through the first series of delay to the first output;

a second series of delay elements having a second input and a second output, wherein a signal on the second input propagates through the second series of delay to the second output, wherein the first output is coupled to the second input; and a control circuit coupled to the first and second series of delay elements, wherein the control circuit selectively filters signal state transitions from propagating into the second input from the first output in response to a reset signal.

19. The memory device of claim 18 wherein the control circuit comprises a latch circuit coupled between the first output and the second input, the latch circuit is configured to propagate a predetermined number of signal state transitions from the first output to the second input, and configured to latch the second input in response to a reset signal.

20. A method of loading a shift register of a memory device, the method comprising:

receiving an input clock signal;

generating an internal clock signal as a delayed version of the input clock signal;

preloading each of a plurality of series coupled delay elements with a high state;

providing a start signal having a step from a high state to a low state, wherein the step corresponds to a high to low signal transition of the internal clock signal;

coupling the start signal to an input of the plurality of series coupled delay elements, wherein the start signal propagates through the plurality of series coupled delay elements; and copying a content of the a plurality of series coupled delay elements into the shift register after the step of the start signal reaches a predetermined propagation location in the plurality of series coupled delay elements.

21. The method of claim 20 wherein copying the content of the a plurality of series coupled delay elements is performed in synchronization with a high to low transition of the external clock signal.

* * * * *

UNITED STATES PATENT AND TRADEMARK OFFICE
CERTIFICATE OF CORRECTION

PATENT NO.       : 7,332,950 B2                                    Page 1 of 1
APPLICATION NO.  : 11/152325
DATED            : February 19, 2008
INVENTOR(S)      : Blodgett It is certified that error appears in the above-identified patent and that said Letters Patent is hereby corrected as shown below:

In column 10, line 14, in Claim 12, delete "the a" and insert -- the --, therefor.

In column 10, line 38, in Claim 15, delete "the a" and insert -- the --, therefor.

In column 12, line 22, in Claim 20, delete "the a" and insert -- the --, therefor.

In column 12, line 27, in Claim 21, delete "the a" and insert -- the --, therefor.

Signed and Sealed this

Tenth Day of June, 2008

JON W. DUDAS
*Director of the United States Patent and Trademark Office*